(12) United States Patent
Mahefkey et al.

(10) Patent No.: US 8,235,096 B1
(45) Date of Patent: Aug. 7, 2012

(54) HYDROPHILIC PARTICLE ENHANCED PHASE CHANGE-BASED HEAT EXCHANGE

(75) Inventors: Edward T. Mahefkey, Flowery Branch, GA (US); Louis Chow, Orlando, FL (US); Ming Su, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 14 days.

(21) Appl. No.: 12/755,797

(22) Filed: Apr. 7, 2010

Related U.S. Application Data

(60) Provisional application No. 61/167,402, filed on Apr. 7, 2009.

(51) Int. Cl.
*F28D 15/00* (2006.01)
*H05K 7/20* (2006.01)

(52) U.S. Cl. .............. 165/104.26; 165/104.33; 361/700

(58) Field of Classification Search ............... 165/80.4, 165/104.26, 104.33; 361/700
See application file for complete search history.

(56) References Cited

U.S. PATENT DOCUMENTS

| | | | | |
|---|---|---|---|---|
| 3,387,767 | A * | 6/1968 | Hecht | 417/48 |
| 3,680,189 | A * | 8/1972 | Noren | 29/890.032 |
| 3,762,011 | A * | 10/1973 | Staudhammer et al. | 419/2 |
| 4,263,371 | A * | 4/1981 | Franz | 428/432 |
| 4,885,129 | A | 12/1989 | Leonard et al. | |
| 5,441,919 | A * | 8/1995 | Park et al. | 501/80 |
| 6,293,333 | B1 * | 9/2001 | Ponnappan et al. | 165/104.26 |
| 6,460,612 | B1 * | 10/2002 | Sehmbey et al. | 165/96 |
| 6,855,422 | B2 * | 2/2005 | Magill et al. | 428/373 |
| 7,002,247 | B2 * | 2/2006 | Mok et al. | 257/713 |
| 7,011,145 | B2 * | 3/2006 | Yeh et al. | 165/104.21 |
| 7,401,643 | B2 * | 7/2008 | Queheillalt et al. | 165/104.21 |
| 7,694,726 | B2 * | 4/2010 | Chen | 165/104.26 |
| 2003/0141045 | A1 * | 7/2003 | Oh et al. | 165/104.26 |
| 2006/0131002 | A1 * | 6/2006 | Mochizuki et al. | 165/104.26 |
| 2006/0137859 | A1 * | 6/2006 | Lin | 165/104.26 |
| 2006/0151153 | A1 * | 7/2006 | Chen | 165/104.26 |
| 2007/0089865 | A1 * | 4/2007 | Rosenfeld et al. | 165/104.26 |
| 2008/0210407 | A1 * | 9/2008 | Kim et al. | 165/104.26 |
| 2009/0025910 | A1 * | 1/2009 | Hoffman et al. | 165/104.26 |
| 2009/0056917 | A1 * | 3/2009 | Majumdar et al. | 165/104.26 |

* cited by examiner

*Primary Examiner* — Cheryl J Tyler
*Assistant Examiner* — Brandon M Rosati
(74) *Attorney, Agent, or Firm* — Jetter & Associates, P.A.

(57) ABSTRACT

A heat pipe includes a sealed thermally conductive casing having a length that has a first end for coupling to a heat source to be cooled and a second end for coupling to a heat sink opposite the first end. The casing has an inside surface that defines a thermal control volume above. The thermal control volume includes (i) a plurality of hydrophilic particles or clusters of hydrophilic particles in a size range from nano size to micron size attached as a hydrophilic film to the inside surface or to a wick on the inside surface, wherein the plurality of hydrophilic particles occupy only a portion of an area of the inside surface or an internal pore space of the wick or a surface area of the wick, (ii) a vapor cavity above the hydrophilic film or the wick, and (iii) a heat transfer working fluid contained as a liquid on the hydrophilic film or the wick, and as a vapor in the vapor cavity. The plurality of hydrophilic particles or clusters of hydrophilic particles provide a solid-liquid contact angle for the working fluid when in a liquid state of <30 degrees, typically <10 degrees.

12 Claims, 5 Drawing Sheets

HYDROPHILIC PARTICLE ENHANCED PHASE CHANGE-BASED HEAT EXCHANGE

CROSS REFERENCE TO RELATED APPLICATIONS

This application claims the benefit of Provisional Application Ser. No. 61/167,402 entitled "Particle Enhanced Heat Exchange", filed Apr. 7, 2009, which is herein incorporated by reference in its entirety.

FEDERAL RIGHTS STATEMENT

The U.S. Government has rights to embodiments of the invention based on Air Force Research Laboratory grant #FA8650-09-2-2940 entitled "Dynamic Heat Generation Modeling and Thermal Management of Electromechanical Actuators."

FIELD

Disclosed embodiments relate to phase change based heat and heat exchange devices, such as heat pipes and reflux boilers.

BACKGROUND

Heat pipes use successive evaporation and condensation of a working fluid to transport thermal energy, or heat, from a heat source to a heat sink. Because most working fluids have a high heat of vaporization, heat pipes can transport large amounts of heat in a vaporized working fluid. Further, the heat can be transported over relatively small temperature differences between the heat source and heat sink. Heat pipes generally use capillary forces through a porous wick to return condensed working fluid, or condensate, from a heat pipe condenser section (where transported thermal energy is given up at the heat sink) to an evaporator section (where the thermal energy to be transported is absorbed from the heat source).

FIG. 1 shows a longitudinal cutaway view of a typical heat pipe 100 that includes a conventional wick. Heat pipe 100 is shown being shorter than is typical to show all elements in a single figure. The primary elements of heat pipe 100 are a hermetically sealed container 112, a wick 114 and an interior vapor space 116. Typically the wick 114 is composed of a porous metal with mean pore diameters of about 100 μm, or fine axial grooves of similar width and depth. Known heat pipes also generally incorporate sintered powder "bi-porous" metal wicks which have two different dominant pore sizes to promote both low liquid pressure drop and high capillary pumping pressures, typically 100 μm transport pores and 30 μm pumping pores. In addition to porous media wicks small axial grooves are also often in heat pipes.

To reveal details, one end cap for sealed container 112 is not shown. Saturated inside wick 114 is a liquid working fluid (or coolant) 118, which typically comprises ammonia, methanol, water, sodium, lithium, fluorinated hydrocarbons or other fluid selected for its high heat of vaporization and acceptable vaporization temperature and other transport properties in a preselected temperature range within which the heat pipe 100 will operate. Heat pipe 100 typically includes an evaporator section 120, an optional adiabatic section 122 and a condenser section 124.

In operation, the evaporator section 120 of the heat pipe is placed into thermal contact with a heat source 126 and the condenser section 124 is placed into thermal contact with a heat sink 128. As thermal energy from heat source 126 is supplied to evaporator section 120, liquid working fluid 118 impregnating the wick 114 absorbs the thermal energy and begins to vaporize, undergoing a phase change from liquid to vapor. The vapor pressure of the heated working fluid 118 in the evaporator forces the vapor through vapor space 116 toward condenser section 124 of the heat pipe 100. Because condenser section 124 is at lower temperature than evaporator section 120 and the vaporization temperature of working fluid 118, the vapor condenses back into a liquid, giving up to heat sink 128 its latent heat of vaporization, which was acquired in evaporator section 120. The now again liquid phase working fluid 118 is absorbed by wick 114 in condenser section 124 and capillary action wicks the liquid back toward evaporator section 120 where it is again available for evaporation. This process rapidly reaches equilibrium and operates continuously as long as heat is supplied.

The type of working fluid 118 generally influences and limits the performance of heat pipe 100 in several ways. These are usually related to the "transport properties" of the working fluid 118, which is generally defined by a Figure of Merit known as the Liquid Transport Factor (M), given by the following equation:

$$M = (\rho_L * \sigma * \lambda * \cos \theta) / \mu_L$$

Where M=Liquid Transport Factor; $\rho_L$=Liquid Density; $\sigma$=Surface Tension; $\lambda$=Enthalpy of Vaporization, $\theta$ is the wetting angle, and $\mu_L$=Liquid Viscosity. As known in the art, $\rho_L$, $\sigma$, and $\lambda$ all decrease with increasing temperature (T), and $\mu_L$ increases with increasing T. Provided the working fluid is operable within the desired temperature range, the working fluid is often selected based on its Enthalpy of Vaporization ($\lambda$) in an attempt to maximize M and thus increase the heat transfer efficiency of the heat pipe or other heat transfer device. Another class of evaporating/condensing heat transfer device is the reflux boiler, which utilizes gravity rather than wick capillary pumping used by typical heat pipe 100 to return liquid from the condenser to the evaporator. Reflux boilers are also known as wickless heat pipes, or two-phase closed thermosyphons.

SUMMARY

Disclosed embodiments provide heat pipes that include nano size or micron size hydrophilic particles of clusters of such particles on the inner surface of reflux boilers or within heat pipe wicks. As used herein the term "heat pipe" includes both heat pipes having wicks and wickless heat pipes. Disclosed embodiments can be applied to a class of heat pipes referred to as "variable conductance" heat pipes where a controlled amount of inert gas (e.g., argon) is introduced intentionally during operation to moderate the active heat transfer length of the condenser, because an inert gas does not affect the wetting properties of the wick.

Surfaces which exhibit wetting angles <10 degrees are termed "super hydrophilic" herein. In addition, surfaces which exhibit wetting angles <30 degrees are termed "hydrophilic" herein. For embodiments where the working fluid is a fluid other than water, the terms "hydrophilic" and "super hydrophilic" can be generalized to their respective contact angle definitions.

For heat pipes having wicks, the wick is generally coated, infused and or intercolated with a plurality of hydrophilic or super hydrophilic particles. Applied to wickless heat pipes, the hydrophilic particles are generally bonded to the inner wall of the device, such as by electrostatic forces (e.g., Vander Walls forces). Other phase change based heat exchange (e.g., such as spray cooling-based) can also benefit from disclosed embodiments.

DETAILED DESCRIPTION

Figure 1:
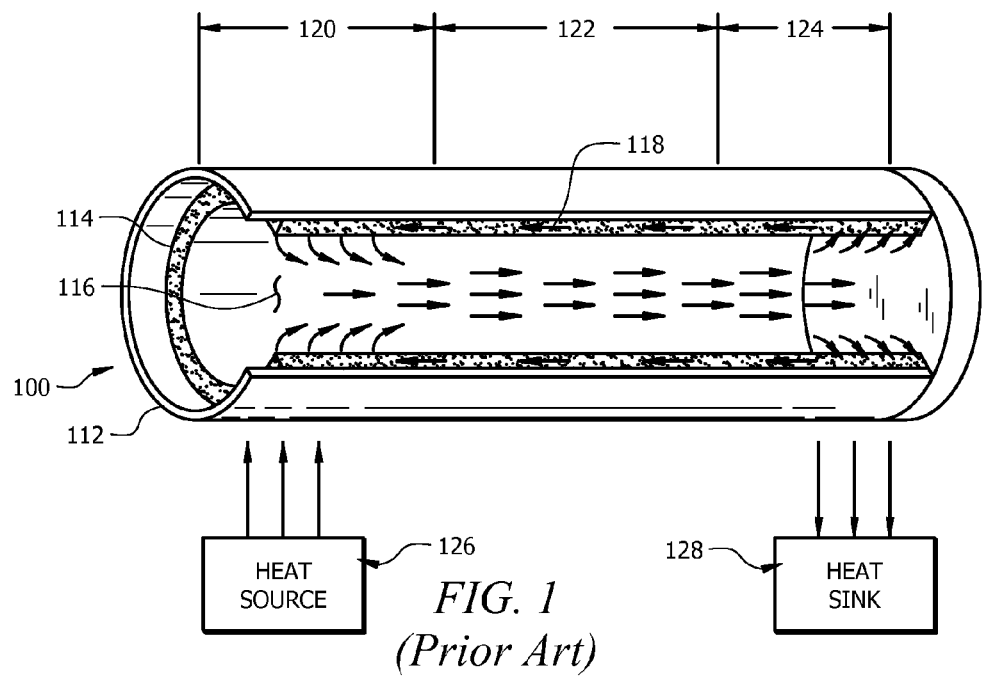
FIG. 1 shows a longitudinal cutaway view of a typical heat pipe that includes a conventional wick.

Disclosed embodiments are described with reference to the attached figures, wherein like reference numerals, are used throughout the figures to designate similar or equivalent elements. The figures are not drawn to scale and they are provided merely to illustrate subject matter disclosed herein. Several disclosed aspects are described below with reference to example applications for illustration. It should be understood that numerous specific details, relationships, and methods are set forth to provide a full understanding of subject matter in this Disclosure. One having ordinary skill in the relevant art, however, will readily recognize that embodiments of the invention can be practiced without one or more of the specific details or with other methods. In other instances, well-known structures or operations are not shown in detail to avoid obscuring certain detail. This Disclosure not limited by the illustrated ordering of acts or events, as some acts may occur in different orders and/or concurrently with other acts or events. Furthermore, not all illustrated acts or events are required to implement a methodology in accordance with this Disclosure.

The Inventors have recognized that hydrophilic particles when infused into phase change-based heat exchange devices reduce the wetting angle $\theta$. As described in the Background above, the liquid Transport Factor (M) is directly proportional to cosine of the wetting angle $\theta$. Under conditions of zero or near zero contact angle, for example, the working fluid spreads across the surface of a solid in a thin film, as opposed to beading up on the surface. As a result, enhancements to wetting (i.e., reduced wetting angle $\theta$) of the working fluid at the wick surface for heat pipes having wicks or the inner surface of wickless heat pipes has been found by the Inventors to provide significant performance improvements.

Figure 2A:
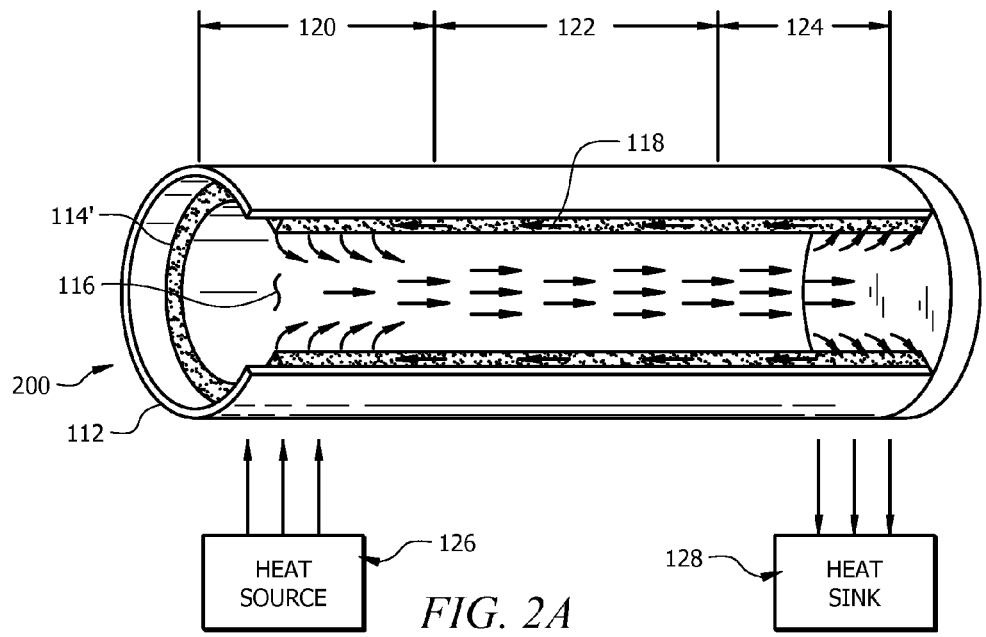
FIG. 2A shows a longitudinal cutaway view of a heat pipe having a wick that comprises a plurality of hydrophilic particles in a size range from nano size to micron size attached to the wick, according to a disclosed embodiment.

FIG. 2A shows a longitudinal cutaway view of a heat pipe 200 having a wick 114' that comprises a plurality of hydrophilic particles or clusters of such particles in a size range from nano size or micron size attached to the wick, according to a disclosed embodiment. Other than wick 114', heat pipe 200 is generally analogous to heat pipe 100 shown in FIG. 1. The individual hydrophilic particles can be 1 nm to 1 µm in size, and when clustered are generally range in size from 10 nm to 5 µm.

Figure 2B:
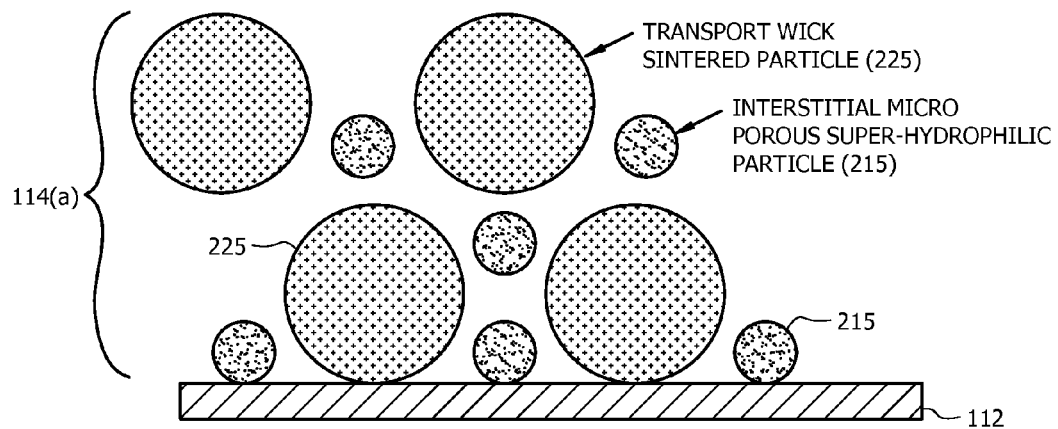
FIG. 2B shows a depiction of an exemplary porous wick, where the plurality of hydrophilic particles occupy only a portion of the internal pore space of the wick and surface area of the wick, according to a disclosed embodiment.
Figure 2C:
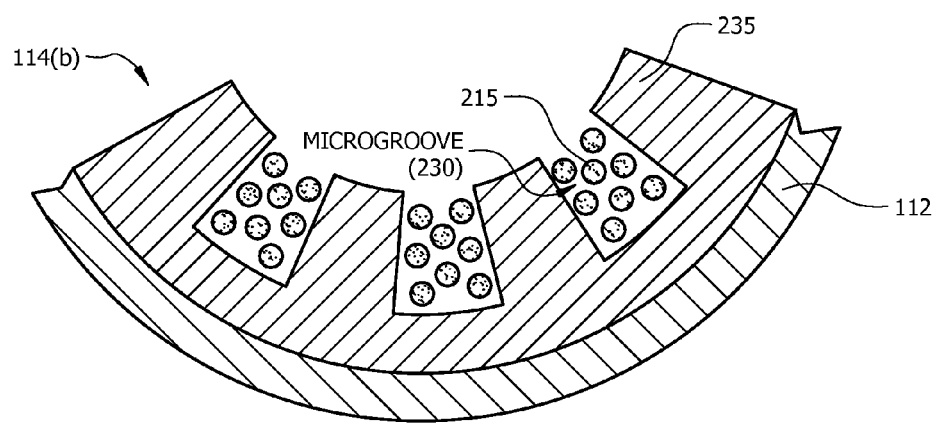
FIG. 2C shows a depiction of an exemplary grooved wick, where the plurality of hydrophilic particles occupy only a portion of the groove space, according to a disclosed embodiment.

FIG. 2B shows a depiction of an exemplary porous wick 114(a) comprising a plurality of sintered particles 225, where the plurality of hydrophilic particles 215 can be seen to occupy only a portion of the internal pore space and surface area of the porous wick, according to a disclosed embodiment. In one embodiment the wick comprises a porous metallic wick having a plurality of pores, where the internal pore space of the plurality of pores define an interstitial pore volume. The Inventors have recognized that adding too many hydrophilic particles 215 will have the undesirable effect of reducing the flow area within the pores thus increasing the pressure loss. However, adding hydrophilic particles 215 to occupy a small % of the interstitial pore volumes between the large pores has minimal impact on pressure drop within the pores. These particles generally should occupy only small portion of the interstitial pore volume, such as 2 to 30%, and 2 to 10% in one embodiment. FIG. 2C shows a depiction of an exemplary micro-grooved wick 114(b), where the plurality of hydrophilic particles 215 coat and fill a portion of the micro-groove spaces 230 that are between the microfeatures 235, according to a disclosed embodiment.

Figure 3A:
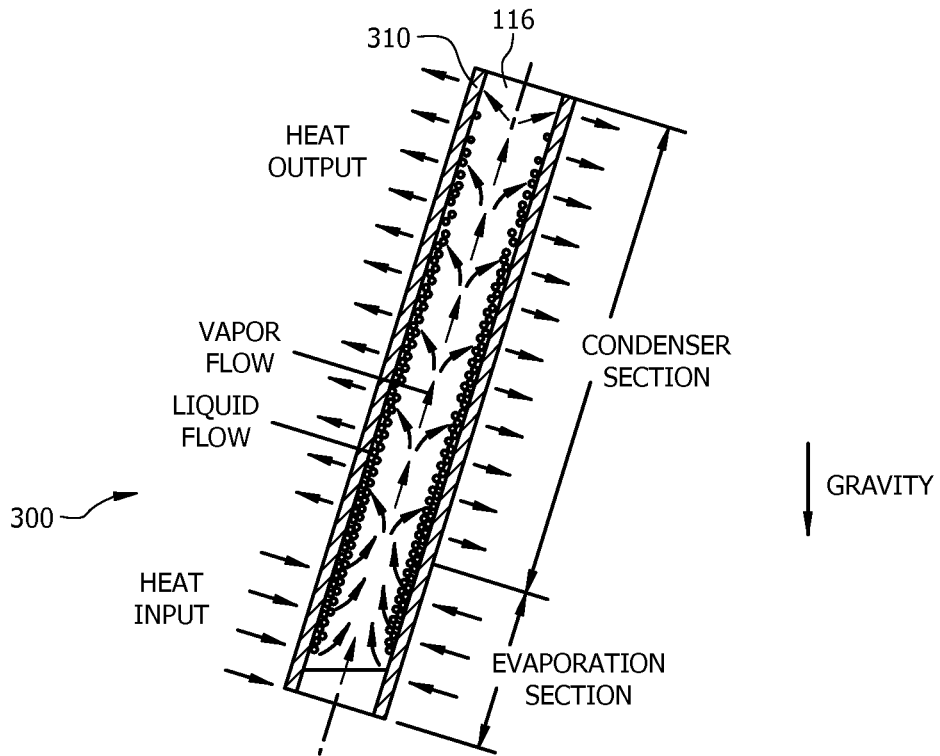
FIG. 3A shows a depiction of an reflux boiler having a plurality of hydrophilic particles that occupy only a portion of an area of its inside surface, according to a disclosed embodiment.
Figure 3B:
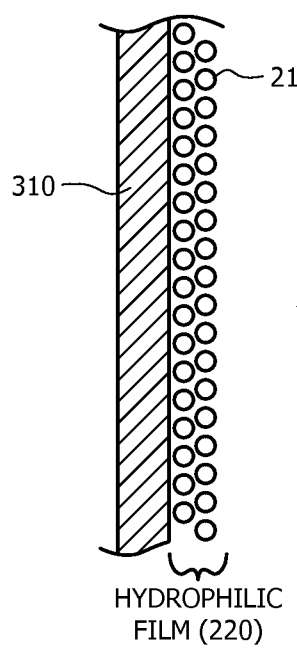
FIG. 3B shows a depiction of the inside surface of the reflux boiler shown in FIG. 3A.

FIG. 3A shows a depiction of a reflux boiler 300 having a plurality of hydrophilic particles 215 that occupy only a portion of an area of its inside surface 310, according to a disclosed embodiment. FIG. 3B shows a depiction of the inside surface 310 of the reflux boiler shown in FIG. 3A showing plurality of hydrophilic particles 215 that collectively comprise a hydrophilic film 220. The inner surface of the reflux boiler can be porous to promote wetting the wall.

Conventional heat pipe and reflux boiler performance operating envelopes are known to be governed by distinct thermophysical limits. At steady state, there are 5 different limits that control the amount of heat transfer during the heat pipe or reflux boiler operation:
1. Vapor Sonic Limit [varies as vapor velocity $V^1$]
2. Vapor Viscous Limit [varies as $V^2$]
3. Vapor-Liquid Entrainment Limit [varies as $V^2$]
4. Liquid Capillary Transport Wicking Limit
5. Liquid/Wick Boiling Limit The addition of a hydrophilic particles or clusters of such particles as disclosed herein to a heat pipe such as a conventional high performance bi-porous sintered metallic or grooved wick or a reflux boiler, can improve all five these limits. This can be explained as a reduction of overall thermal resistance of the device by incorporation of the hydrophilic particles. Reducing the thermal resistance allows operation at lower temperature for a given heat load, thereby lowering the operating, pressure, mass flow rate and velocity and increasing liquid capillary pumping pressure.

Figures 4A, 4B:
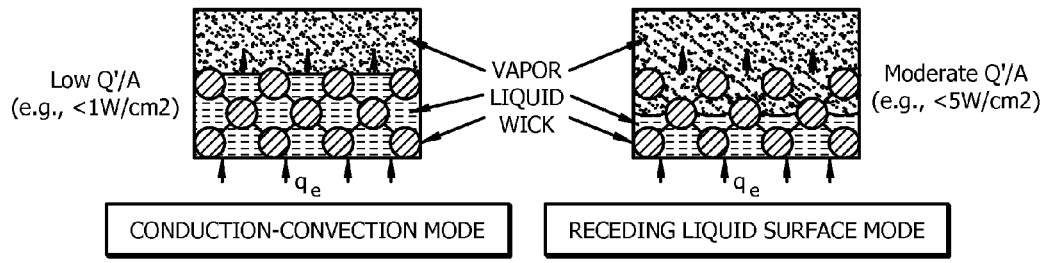
FIGS. 4A-D show four distinct regions of operation of the heat pipe evaporator as a function of applied evaporator heat flux.
Figures 4C, 4D:
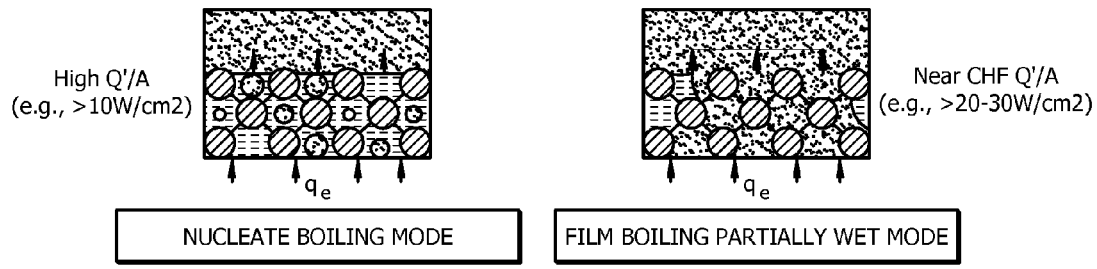

FIGS. 4A-D show four distinct regions of operation of the heat pipe evaporator as a function of applied evaporator heat flux. The wick boiling limit is of particular importance to device performance enhancement. The fluxes noted in these FIGs. are representative of conventional sintered powder wick water heat pipe performance. Higher fluxes are possible for small evaporators (e.g., ~1-10 cm$^2$). The film boiling partially wet mode depicted in FIG. 4D is the highest performance mode in terms of accommodating high heat fluxes, but is often avoided in practice because inadvertent wick dryout and thermal runaway can occur which can create unsafe conditions. However, if rapid rewetting of the pores can be promoted by incorporating of hydrophilic wick elements as disclosed herein, consistently safe operation of heat pipe evaporators at high heat fluxes can be provided.

Heat transfer in the evaporator is mainly by thermal conduction through the liquid filled wick and evaporation at the liquid vapor interface at low heat fluxes. At high heat flux the liquid in the porous structure exceeds saturation conditions, nucleates vapor bubbles within the wick, and consequently starts to boil. The formation of vapor bubbles in the wick can disrupt the capillary flow in both the radial and axial directions and may lead to an effect analogous to film boiling in the wick porous media. If the bubbles do not exit the porous media quickly enough, a vapor blanket forms at the heated wall, preventing the liquid from re-wetting the heated "evaporator" wall. Evaporator performance can be improved significantly as the evaporator approached dry out in compound multilayer screen wicks with concentric inner axial liquid-in-groove resupply configuration.

The hydrophilic particles or clusters of hydrophilic particles disclosed herein promote hydrophilic wetting of the pores. This improvement is achieved in part by increasing the meniscus surface area and total interline heat transfer area within individual pores, and improved rewetting speed characteristic of hydrophilic surfaces as described below.

Figure 5A:
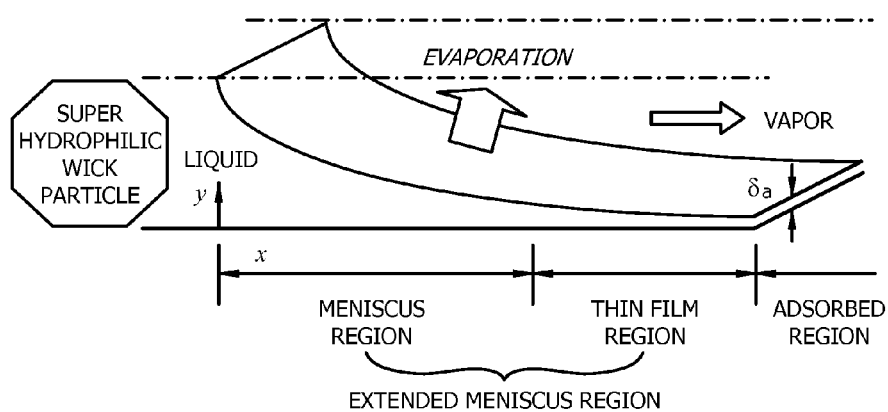
FIG. 5A shows a depiction of an interline meniscus between adjacent hydrophilic particles, according to a disclosed embodiment.
Figure 5B:
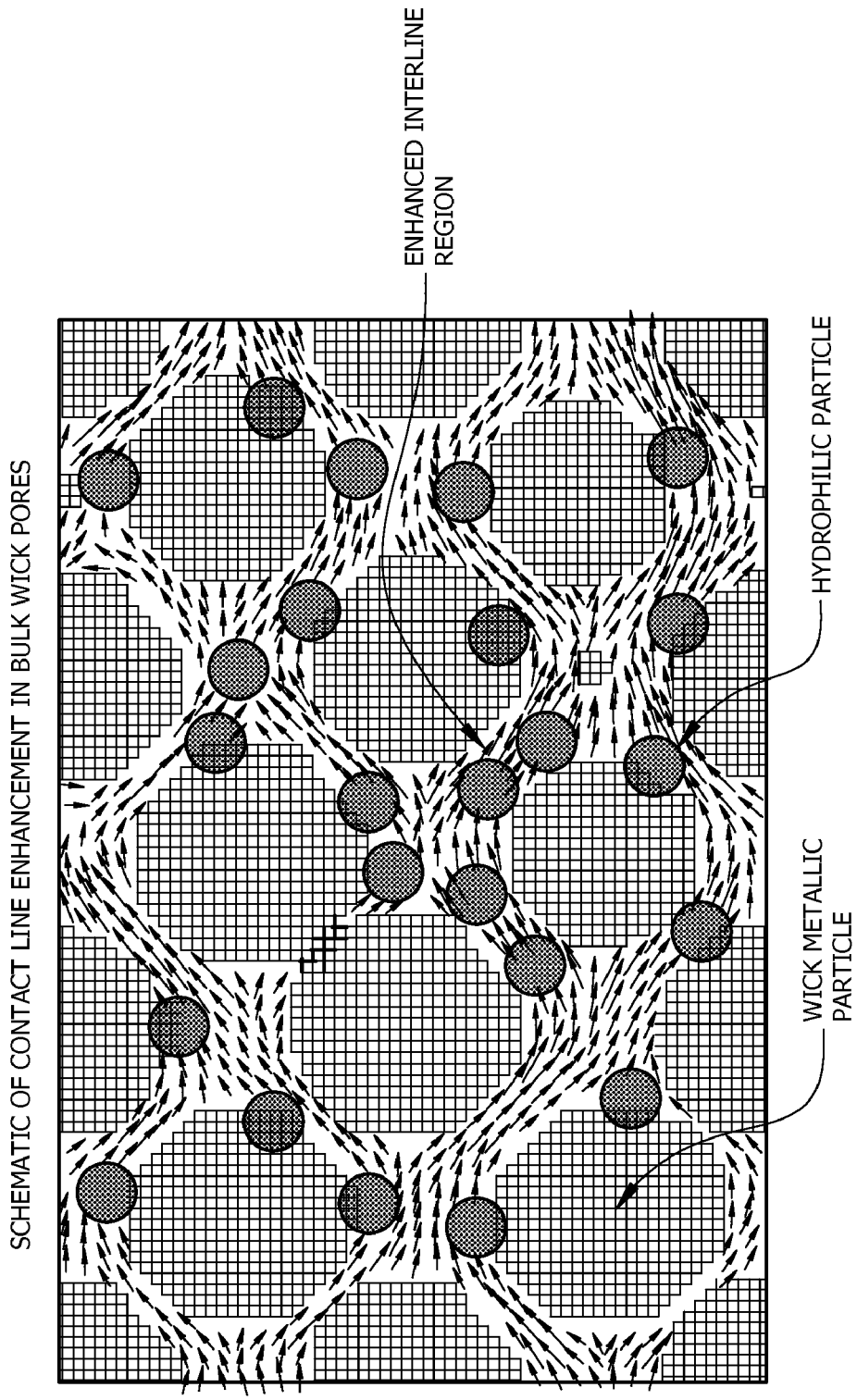
FIG. 5B shows a depiction of contact line enhancement in bulk wick, according to a disclosed embodiment.

FIG. 5A shows a depiction of an interline meniscus between adjacent hydrophilic particles, according to a disclosed embodiment. A meniscus region, thin film region, and an adsorbed region are shown. Neighboring particles are not shown. FIG. 5B shows a depiction of contact line enhancement in bulk wick, according to a disclosed embodiment.

In conventional heat pipe wicks, the maximum capillary pumping pressure is related to the surface tension of the liquid, the contact angle between the liquid and vapor at the pore's solid surface and the pore radius or effective channel is given by:

$$\Delta P_{cap} = 2\sigma \cos\theta / r_{eff\,pore}$$

where $r_{eff}$ is the effective pore radius. Offsetting this liquid capillary pumping is the pressure loss due to fluid friction in the wick, given by Darcy's Law. For a given heat pipe length and wick cross sectional area and fluid mass flow rate, the pressure drop in the wick is:

$$\Delta P = \mu_L m'_L / K A_W \rho_L L$$

where K is wick permeability and is given by:
$K = \epsilon D_h^2 / 32$ so the viscous pressure loss can be written as:

$$\Delta P_{liq} = 32 \mu_L m'_L / \epsilon D_h^2 A_W \rho_L L$$

where for a circular pore $D_h = 2r_{pore}$.

In practice, the effective macroscopic pore radius for a given wick is measured experimentally by wick rise tests and the permeability determined experimentally by liquid flow pressure drop over a given wick length of know cross section and porosity. It is important to note that capillary pumping pressure must be equal to or greater than liquid viscous pressure loss. For high capillary pumping a small radius pore is desired. For low liquid viscous pressure loss, a large hydraulic diameter pore, $D_h = 2r_{pore}$ is required. It should also be noted that the maximum capillary pressure exists for a given fluid and pore radius when the cosine θ is unity, corresponding to a wetting angle of zero degrees. As noted above, surfaces which exhibit wetting angles close to zero defined as <10 degrees are generally termed "super hydrophilic". In addition, surfaces which exhibit wetting angles <30 degrees are termed "hydrophilic".

As disclosed above, the Inventors have recognized that adding too many hydrophilic particles will have the undesirable effects of reducing the flow area within the pore and increasing the pressure loss. However, a limited concentration of hydrophilic particles or clusters of particles to the interstitial regions between the large pores has minimal impact on pressure drop within the pore.

Also disclosed herein are methods of manufacturing high performance heat pipe wicks which incorporate near nanoscale hydrophilic particles infused in microscale porous wicks of relatively low permeability and liquid flow resistance. This can be accomplished by first creating nanoscale clusters of particles by chemisorption activation of the nano cluster particle surface. For examples, in the case of silicon particles, although silicon is normally more hydrophobic than silica, etching the surface such as in HF, results in making the cluster more hydrophilic, including super-hydrophilic silicon by removing native oxides and adding a few monolayers of the working fluid to promote super hydrophilic behavior.

The chemisorbed hydrophilic nanoparticles or clusters of such nanoparticles are then infused into the macroscale porous wick, and the heat pipe is filled and processed by conventional methods. This results in local near zero contact angle in the vicinity of the infused nanocluster in the macroscopic wick, and greatly enhancing the surface area of the macroscopic pore and increasing heat flux capability without significantly increasing the liquid pressure drop characteristics of the wick.

Benefits of hydrophilic enhanced heat pipes include at the device level, a significant reduction (e.g., 2×) of heat pipe thermal resistance; thus lowering operating temperature, pressure, mass flow rate and increasing transport distance by increased surface tension. Enhance evaporator critical heat flux and area (e.g., 2-5×) without burn out. Reduced sensitivity to high g loadings and peak transients via rapid rewetting. As described above, disclosed embodiments apply to reflux boilers and grooved wick heat pipes, not just sintered metallic wick heat or grooved pipes.

Several improvements are enabled by several novel thermo-physical mechanisms described above. For example, reduced contact angle due to super-hydrophilic particle infusion into conventional bi-porous metallic wick structure with minimum impact on overall porosity and permeability. Significantly enhanced interline particle-to-particle surface area and thin film evaporation area. in addition, retardation of boiling incipience via super hydrophilic rewetting and re-priming large pores and nucleation sites.

Disclosed embodiments include methods of cooling components including electronic components, and heat pipes and related heat transfer devices therefrom. The chemisorbed nanoparticles may be viewed as residing in the inter-pore spaces of the relatively large pore spaces for internally porous heat pipe wicks. In a typical application, during operation the coolant is passively recirculated (i.e. there is no external pump), and particles are stationary [immobile] within the pores or on the surface of the wick. However, actively recirculated arrangements of the particles may also be utilized with embodiments of the invention, such as for zero gravity or near-zero gravity applications.

In the case of a conventional heat pipe, the nanoslurry generally wets the wick of the heat pipe. As described above, although embodiments of the invention are generally described relative to a heat pipe having a wick, a wickless device can also be fashioned according to other embodiments of the invention. A wickless device according to an embodiment of the invention coats the wall with SHP particles and utilizes gravity rather than a capillary wick to accomplish fluid recirculation (e.g. a "reflux boiler" or thermosyphon).

Another embodiment, the chemisorbed film thickness is in a range between 3 and 5 monolayers. In terms of thickness, a single monolayer is about 0.2 nm thick for water when the sorbent nanoparticles are silicon. The thin chemisorbed layer enables hydrophilic wetting of the pore in the vicinity of the nanoparticle clusters.

Although generally described as being constant, the film thickness of the working fluid bonded to the sorbent nanoparticles is generally not constant, although generally still in the range from 2 to 10 monolayers. This is analogous to radius of curvature change in a heat pipe wick under differing heat loads. In the evaporator, the film thickness at a given heat load is different than the film thickness in the condenser because more layers are sent carrying energy from the evaporator to the condenser, so that there is a differential film thickness, or a liquid monolayer "concentration gradient" from one end of the heat pipe to the other. This differential generally remains constant with time during operation, or the layers in the evaporator will be depleted, and axial heat transport would cease, creating the so-called "burnout" event in a conventional heat pipe.

Some exemplary sorbents that can be used with embodiments of the invention can comprise, for example, titania (titanium dioxide), silicon, and activated charcoal. Working fluids can comprise, for example, water, ammonia, and methanol or other fluids which have a high heat pipe fluid figure of merit (i.e. high enthalpy of vaporization, moderate vapor pressure, high surface tension, high density, and low viscosity at the temperature of interest). The working fluid is generally selected based on the desired operating temperature, and there is some overlap between fluids. For example, water is generally appropriate between 50-200° C., and is limited by its high vapor pressure at high T, and high viscosity at low T's. Exemplary combinations of sorbent nanoparticle/working fluid that have been identified by the Inventors as providing a significant heat transfer improvement include titania/water, silicon/water, activated charcoal/ammonia, and activated charcoal/methanol.

Clustering to form nanoclusters has been found by the Inventors to add porosity between the nanoparticles which acts as a porous sponge, so that there is pore space to store several monolayers and confine the working liquid. Depending on the types of sorbent nanoparticles, clustering may or may not occur. Clustering is not required, but can help retain more working fluid. The Inventors have identified candidate sorbent materials including silicon, activated carbon and titanium dioxide when prepared as nanosized clusters are compatible with common heat pipe fluids. Discrete sorbent nanoparticles will generally also adsorb an adequate amount of working fluid which can result in an efficient heat transfer.

The working fluid may also include materials other than the nanoparticles and working fluid. For example, catalysts can be added to enhance the number of sorption sites, generally independent of nanoparticle size. One example is Potassium Chromate $K_2CrO_4$, which adds sorption sites or microporosity to activated carbon during thermal pyrolysis of the charcoal. Other common catalysts known for modifying the surface properties of solids may also be used, such as Mo, Co—Mo, Pt, Pd, Ni, $ZrO_2$, $V_2O_5$, ZnO, CuO, $Al_2O_3$, or Ni—MgO.

Other additives to passivate corrosive reactions between the fluid and container wall are commonly used in some types of heat pipes, the fluid-container and chemical cleaning to reduce potential oxidation-reduction in the heat pipe can be used to prevent poisoning or degradation of the sorbent nanoparticles.

Nanoslurries, according to embodiments of the invention, can be formed using a number of methods. The nanoslurry may be prepared as a solution and introduced into the container (e.g. casing) or by combining pre-loaded dry nanoparticles with fluid in situ in a container. The slurry can be allowed to contact the walls of the container and or wick by fluid distribution dynamics, just as one would generally wet the inside of a bottle with a small amount of liquid. The mass ratio of solid to liquid nanoslurry amounts can be determined experimentally, and is in the range of a few percent of the working fluid fill mass.

Alternatively, nanosized sorbent particles can be added directly into the heat pipe or other heat transfer devices, not as a liquid slurry, but as nanopowder. An appropriate amount of working fluid, such as water, may be added later to complete the heat pipe filling process. Furthermore, a variety of activation approaches can be used to enhance the amount of water or other working fluid adsorbed on the nanoparticles. These approaches can include, but are not limited to, thermal, hydrothermal, magnetic, and chemical approaches.

The active surface of the particles can be highly wettable (e.g. super hydrophilic), promoting thin film evaporation and condensation, provided the amount of working fluid is small enough to avoid having sufficient liquid to form puddles or to totally saturate [fill or flood] the heat pipe wick pores. Thus, with unbound working fluid (e.g. free water), but not too much working fluid, the particles' surface (e.g. silicon particle surface) through thermal activation can be super hydrophilic which can significantly enhance spreading of the working liquid thin film. Since this is a free (i.e. unbound) liquid arrangement, the liquid can be capillary pumped analogous to regular liquids, but significantly more efficiently as compared to conventional liquid coolants because the contact angle in the super hydrophilic condition is nearly zero.

Although a larger internal pore surface area is generally used in this embodiment, as described above, micron size particles infused into 100 micron wick pores are generally sufficient, so that nanoparticles become optional. However, a micron (or several microns) thick layer is well in the operational thicknesses range for thin film evaporation and condensation.

The lower operating temperature provided during heat pipe operation is due to lower temperature resistance from inside to outside of the heat pipe at both the evaporator and condenser regions. Therefore the internal temperatures are lower. And the vapor pressure is therefore lower as well because of the Clausius-Claperon relationship for free water (or other working fluid).

Disclosed embodiments largely overcome deficiencies of the conventional heat pipes, which are usually characterized by operating envelope limits, which include capillary pumping limit, viscous flow pressure drop limit, vapor blockage boiling in the wick, sonic vapor flow limit, and entrainment of returning liquid in the counter flowing vapor, and the freezing point and critical point of the working fluid. Hydrophillic particle enhanced heat pipe/reflux boilers according to disclosed embodiments provide significant performance advantages over conventional heat pipes since they require much lower mass flows in both the vapor and liquid phases. There is also operational temperature advantages by virtue of the vapor pressure suppression effect of the working fluid in embodiments where the working fluid is bound to the sorbant nanoparticle surface as described above.

Disclosed embodiments can be used in a wide variety of applications. For example, as heat pipes, for cooling laptop computers, power electronic devices, and permafrost stabilization in cold climates. Also, embodiments of the invention can be used in some military products. Moreover, embodiments of the invention can be used as a thermal protection system for a high-speed air vehicle. For high volume commercial applications such as laptop cooling, heat pipe devices according to embodiments of the invention can generally be manufactured for a few dollars each.

EXAMPLES

Embodiments of the invention are further illustrated by the following specific Examples, which should not be construed as limiting the scope or content of embodiments of the invention in any way.

As mentioned above, chemisorption enabled hydrophilic or super hydrophilic particles or clusters according to embodiments of the invention can be produced in a number of ways. For example, in the case the working fluid is water, nanoclusters can be made by direct hydrothermal decomposition (i.e. cracking) of microparticles into nanoparticles inside the heat pipe. This is analogous to the thermal shock method of cracking a rock with hot water. In this embodiment, in the particular case of silicon, a mixture of silicon microparticles and water can be filled in a heat pipe. After evacuating the air and sealing the ends of the heat pipe, the temperature of the heat pipe is increased to boil water, which produces high temperature water vapor which reacts with the microparticles. The breakdown of microparticles will produce nanoparticles that have large surface areas.

Once the silicon nanoparticles or clusters of such particles have been formed, the native oxide monolayers are removed, typically being about 2 nm thick, and impurities removed from the nanopowder to allow chemisorption of water molecules on the particle surfaces at the bond sights are created by native oxide removal. This technology is well known in the semiconductor industry.

Once the silicon powder surface native oxides are removed, dangling silicon covalent bonds with high reactivity are created at the surface. The powder is then processed by conventional chemisorption vapor deposition of water vapor. These highly ordered chemisorbed water monolayers on the Si surface act as hydrophilic and generally superhydrophilic wetting surfaces.

While various embodiments of the invention have been described above, it should be understood that they have been presented by way of example only, and not as a limitation. Numerous changes to the disclosed embodiments can be made in accordance with the disclosure herein without departing from the spirit or scope of this Disclosure. Thus, the breadth and scope of the invention should not be limited by any of the above-described embodiments. Rather, the scope of the invention should be defined in accordance with the following claims and their equivalents.

Although the disclosed embodiments have been illustrated and described with respect to one or more implementations, equivalent alterations and modifications will occur to others skilled in the art upon the reading and understanding of this specification and the annexed drawings. In particular, variations on binder oxidizer and surfactant will be apparent to those skilled in the art. While a particular feature of the invention may have been disclosed with respect to only one of several implementations, such a feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

We claim:

1. A heat pipe, comprising:
   a sealed thermally conductive casing having a length that comprises a first end for coupling to a heat source to be cooled and a second end for coupling to a heat sink opposite said first end, said casing having an inside surface that defines a thermal control volume above;
   wherein said thermal control volume comprises:
   (i) a wick comprising a plurality of pores having a pore size defining an interstitial pore volume that extends over a full thickness of said wick or a plurality of microgrooves each having a groove space;
   (ii) a plurality of hydrophilic particles or clusters of said hydrophilic particles smaller than said pore size or dimensions of said groove space in a size range from nanosize to 5 microns attached as a hydrophilic film to said wick and distributed throughout said interstitial pore volume or distributed throughout said groove spaces, wherein said plurality of particles or said clusters of said hydrophilic particles occupy only a portion of said interstitial pore volume or said groove space;
   (iii) a vapor cavity above said wick, and
   (iv) a heat transfer working fluid contained as a liquid in said wick, and as a vapor in said vapor cavity,
   wherein said plurality of hydrophilic particles or clusters of said hydrophilic particles comprise activated particles or activated clusters of said hydrophilic particles which have a chemisorbed layer of said working fluid on their surface which provides a solid-liquid contact angle for said working fluid when in a liquid state of <30 degrees.

2. The heat pipe of claim 1, wherein said contact angle is <10 degrees.

3. The heat pipe of claim 1, wherein said wick includes said plurality of microgrooves.

4. The heat pipe of claim 1, wherein said wick includes said plurality of pores, and wherein said pore size is <100 µm.

5. The heat pipe of claim 1, wherein said wick comprises said plurality of pores, and said activated hydrophilic particles or said activated clusters of said hydrophilic particles fill 2 to 30% of said interstitial pore volume.

6. The heat pipe of claim 1, said wick comprises said plurality of pores, and wherein said activated hydrophilic particles or said activated clusters of said hydrophilic particles fill 2 to 10% of said interstitial pore volume.

7. The heat pipe of claim 1, wherein said activated hydrophilic particles or said activated clusters of said hydrophilic particles comprise silicon.

8. The heat pipe of claim 1, wherein said heat transfer working fluid comprises water, ammonia or methanol.

9. A heat pipe, comprising:

a sealed thermally conductive casing having a length that comprises a first end for coupling to a heat source to be cooled and a second end for coupling to a heat sink opposite said first end, said casing having an inside surface that defines a thermal control volume above;

wherein said thermal control volume comprises:

(i) a wick comprising a plurality of pores having a pore size defining an internal pore volume that extends over a full thickness of said wick;

(ii) a plurality of hydrophilic particles or clusters of said hydrophilic particles smaller than said pore size in a size range from nanosize to 5 microns attached as a hydrophilic film to said wick and distributed throughout said internal pore volume, and wherein said plurality of hydrophilic particles or said clusters of said hydrophilic particles occupy only a portion of said interstitial pore volume;

(iii) a vapor cavity above said wick, and (iv) a heat transfer working fluid contained as a liquid in said wick, and as a vapor in said vapor cavity, wherein said plurality of hydrophilic particles or clusters of said hydrophilic particles comprise activated particles or activated clusters of said hydrophilic particles which have a chemisorbed layer of said working fluid on their surface which provides a solid-liquid contact angle for said working fluid when in a liquid state of <10 degrees.

10. The heat pipe of claim 9, wherein said wick comprises said plurality of pores, and said hydrophilic particles or clusters of said hydrophilic particles fill 2 to 10% of said interstitial pore volume.

11. The heat pipe of claim 9, wherein said activated hydrophilic particles or said activated clusters of said hydrophilic particles comprise silicon.

12. The heat pipe of claim 9, wherein said heat transfer working fluid comprises water, ammonia or methanol.

* * * * *